US008981207B1

(12) United States Patent
Pethuraja et al.

(10) Patent No.: US 8,981,207 B1
(45) Date of Patent: Mar. 17, 2015

(54) HIGH EFFICIENCY QUANTUM DOT SENSITIZED THIN FILM SOLAR CELL WITH ABSORBER LAYER

(75) Inventors: Gopal G. Pethuraja, Albany, NY (US);
Roger E. Welser, Providence, RI (US);
Ashok K. Sood, Brookline, MA (US)

(73) Assignee: Magnolia Solar, Inc., Woburn, MA (US)

( * ) Notice: Subject to any disclaimer, the term of this patent is extended or adjusted under 35 U.S.C. 154(b) by 44 days.

(21) Appl. No.: 13/344,163

(22) Filed: Jan. 5, 2012

(51) Int. Cl.
*H01L 31/00* (2006.01)
*H01L 31/0749* (2012.01)
*H01L 31/0352* (2006.01)
*H01L 31/032* (2006.01)
*H01L 31/072* (2012.01)

(52) U.S. Cl.
CPC .......... *H01L 31/0749* (2013.01); *H01L 31/032* (2013.01); *H01L 31/035218* (2013.01); *Y02E 10/541* (2013.01); *H01L 31/0322* (2013.01); *H01L 31/072* (2013.01)
USPC ............................ 136/253; 136/256; 136/260

(58) Field of Classification Search
CPC .............. H01L 31/032; H01L 31/0322; H01L 31/035218; H01L 31/072; H01L 31/0749
USPC .......................................... 136/253, 256, 260
See application file for complete search history.

(56) References Cited

U.S. PATENT DOCUMENTS

2008/0066802 A1* 3/2008 Reddy ........................... 136/258
2010/0288345 A1* 11/2010 Huang ........................... 136/255

OTHER PUBLICATIONS

Repins, et al., "19.9%—Efficient ZnO/CdS/CuInGaSe2 Solar Cell With 80.2% Fill Factor", "Prog Photovolt: Res. Appl.", Feb. 14, 2008, pp. 235-239, No. 16, Publisher: John Wiley & Sons, Ltd.
Schock, et al., "CIGS-Based Solar Cells for the Next Millenium", "Prog. Photovolt. Res. Appl.", 2000, pp. 151-160, No. 8, Publisher: John Wiley & Sons, Ltd.

* cited by examiner

*Primary Examiner* — Matthew Martin
(74) *Attorney, Agent, or Firm* — Loginov & Associates, PLLC; William A. Loginov

(57) ABSTRACT

A photovoltaic (PV) device having a quantum dot sensitized interface includes a first conductor layer and a second conductor layer. At least one of the conductor layers is transparent to solar radiation. A quantum dot (nanoparticle) sensitized photo-harvesting interface comprises a photo-absorber layer, a quantum dot layer and a buffer layer, placed between the two conductors. The absorber layer is a p-type material and the buffer layer is an n-type material. The quantum dot layer has a tunable bandgap to cover infrared (IR), visible light and ultraviolet (UV) bands of solar spectrum.

4 Claims, 3 Drawing Sheets

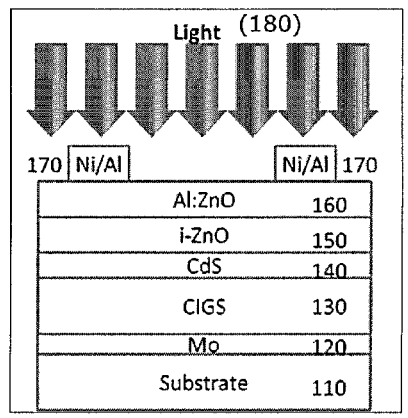 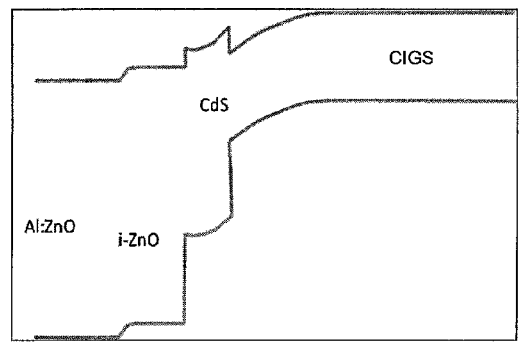
Fig. 1A (Prior Art)    Fig. 1B (Prior Art)
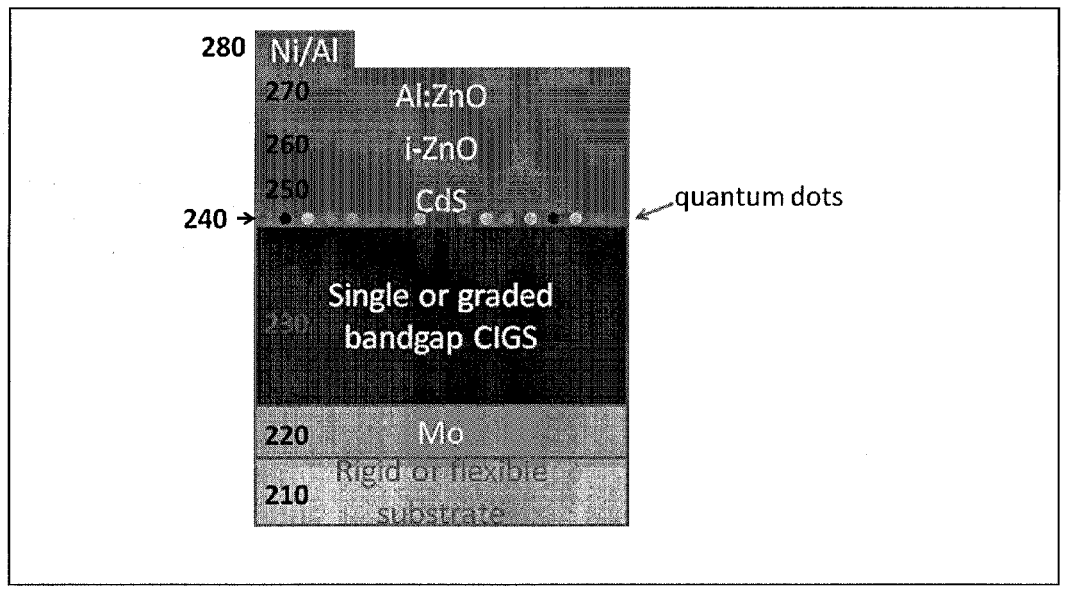
Fig. 2

US 8,981,207 B1

HIGH EFFICIENCY QUANTUM DOT SENSITIZED THIN FILM SOLAR CELL WITH ABSORBER LAYER

FIELD OF THE INVENTION

The present invention relates to semiconductor-based photovoltaic energy converters, also known as "solar cells," and to the design and fabrication of the same.

BACKGROUND OF THE INVENTION

With appropriate electrical loading, photovoltaic solid state semiconductor devices, commonly known as solar cells, convert sunlight into electrical power by generating both a current and a voltage upon illumination. The current source in a solar cell is the charge carriers that are created by the absorption of photons.

CIGS-Based Solar Cells

Copper ternary chalcogenide compounds and alloys are efficient light-absorbing materials for solar cell applications. Their efficiency is due to their direct and tunable energy band gaps, very high optical absorption coefficients in the visible to near-infrared (IR) spectrum range and high tolerance to defects and impurities. Copper indium-gallium-selenium/sulfur (CIGS) thin film solar cells provide the advantages of low-cost, high-efficiency, long-term stability, superior performance under weak illumination, and desirable resistance to radiation. For useful background material, refer, for example, to H. W. Schock et al., "CIGS-based Solar Cells for the Next Millennium," *Prog. Photovolt. Res. Appl.* 8, 151-160 (2000).

Unlike the basic silicon solar cell, which can be described as a simple p-n junction device, CIGS based solar cells comprise a more complex heterojunction system. Solar cells based on CIGS have achieved the highest efficiency of existing thin film solar cells.

A cross-sectional view of an exemplary CIGS device in accordance with a prior art embodiment is shown in FIG. 1. The various layers of the solar cell are deposited on a substrate 110. Solar cells based on p-type CIGS absorbers are typically fabricated on glass, polymer, stainless steel or other substrates 110 using various deposition techniques known in the art. Incident sunlight 180 is partially blocked by the metallic grid shown as contact elements 170, which covers approximately 5% of the surface of the device. These contact elements 170 can comprise Ni/Al fingers or other appropriate contact elements. The incident sunlight 180 is partially reflected by the surface of the transparent conducting-oxide (TCO) layer 150 and 160, shown as a i-ZnO/ZnO:Al layer, due to the difference in the index of refraction. Some short-wavelength photons are absorbed in the n-CdS layer 140. Most of the sunlight, however, enters the semiconductor and is absorbed in the CIGS absorber layer 130. The CIGS absorber layer 130 is shown disposed on molybdenum (Mo) layer 120, which is disposed on a stainless steel substrate 110 as shown. Other substrates known in the art are expressly contemplated, including glass and polymers.

The front metal contact fingers (Ni/Al) 170 are optional and are not required for operation of the photovoltaic device. The ZnO layers 150&160 and CdS layer 140 typically comprise n-type material, and the CIGS 130 layer typically comprises p-type material. The semiconducting junction is formed at or proximate to the CdS-CIGS (n-p) interface. Electrons that are generated within the junction-field region or within about one diffusion length of the n-p junction will generally be collected.

According to standard prior art CIGS thin film solar cells, a highest efficiency of 19.9% has been achieved with an effective area of 0.42 $cm^2$ prepared by the so-called three-stage co-evaporation process. For useful background material on efficiencies of CIGS solar cells, refer, for example, to I. Repins et. al., "19.9% efficient ZnO/CdS/CuInGaSe$_2$ solar cell with 81.2% fill factor", Prog. Photovolt: Res. Appl. 2008; 16:235-239.

QD-Enhanced Solar Cells

The efficiency of a solar cell can also be enhanced when a quantum dot (QD) effect is applied to a solar cell, thereby significantly improving the energy conversion rate thereof. Quantum dots have bandgaps that are tunable across a wide range of energy levels by changing the size (i.e. diameter) of the quantum dots. The quantum dot effect achieved by a quantum dot solar cell generally relates to an impact ionization effect and an Auger recombination (AR) effect.

The impact ionization effect occurs in semiconductor material, when energy of two bandgaps is provided from external, excited electrons can exist in form of hot electrons. When the hot electrons are transited form high energy level to low energy level excitation state, the released energy can excite another electron from a valence band to a conduction band, and such phenomenon is referred to as the impact ionization effect. According to the impact ionization effect, one high energy photon can excite two or more hot electrons.

The other effect is an Auger recombination (AR) effect relative to the impact ionization effect. The AR effect refers to the energy released in the semiconductor material due to recombination of hot electrons and holes can excite another hot electron to transit to a higher energy level, thereby prolonging a lifetime of the hot electron in the conduction band.

When the semiconductor material displays a quantum dot size, the continuous conduction band is gradually split into small energy levels, so that the cooling speed of the electrons is slowed down, and therefore the impact ionization effect and the Auger recombination effect can be effectively utilized. According to theoretical calculations, the tradition single junction solar cell only can achieve 31% energy conversion efficiency, and if combining with the impact ionization and Auger recombination effects, the maximum theoretical efficiency of the solar cell can be 66%, which confirms the potential ability to use the quantum dots in the solar cell.

Solar cells made from photosensitive nanoparticles show very low efficiencies. Nanoparticles are very efficient in generating electron-hole charge pairs when exposed to sunlight. The primary reason for the low efficiencies is charge recombination. To achieve high efficiencies in a solar cell the charges are desirably separated as soon as possible after they are generated. Charges that recombine do not produce any photocurrent and hence do not contribute towards solar cell efficiencies. Charge recombination in nanoparticles is primarily due to two factors: (a) Surface states on nanoparticles that facilitate charges recombination and (b) Slow charge transport. In nanoparticles/QD solar cells, the charge recombination is faster as compared to charge transport.

Electricity produced by a solar cell is expensive due to high solar cell module cost. In order to significantly reduce the cost of solar electricity, it is desirable to both increase cell efficiency and to significantly reduce the costs of photovoltaic (PV) module fabrication. A thin film form of cell reduces the fabrication cost, but yields relatively lower efficiency compared to a single crystalline wafer based cell. Thus, it is desirable to provide a system and method to enhance efficiency of the solar cell.

SUMMARY OF THE INVENTION

The present invention overcomes the disadvantages of the prior art by providing a photovoltaic (PV) device having a quantum dot sensitized interface and an absorber layer. In an illustrative embodiment, the photovoltaic device includes a first conductor layer and a second conductor layer, in which at least one of which is transparent to solar radiation. The quantum dot (nanoparticle) sensitized photo-harvesting interface comprises a photo-absorber layer, a quantum dot layer and a buffer layer, placed between the two conductors.

The quantum dot sensitized interface PV device is fabricated or otherwise synthesized according to an illustrative procedure that commences by providing a substrate. A bottom electrode layer is then deposited on the substrate, and an optical absorber layer is deposited on the bottom electrode. A quantum dot layer is formed on the optical absorber layer. A buffer layer is then deposited on the quantum dot layer and a quantum dot layer is thereby formed at the interface of the optical absorber and the buffer layer. The procedure then deposits top light transparent electrode layers on the buffer layer to complete the PV device having a quantum dot sensitized interface. The resulting PV device provides improved efficiency over the prior art CIGS-based and/or QD-enhanced solar cells.

BRIEF DESCRIPTION OF THE DRAWINGS

The invention description below refers to the accompanying drawings, of which:

FIG. 1A, already described, is a schematic cross-sectional view of a copper indium-gallium-selenium/sulphur (CIGS) thin film solar cell device according to a prior art illustrative embodiment;

FIG. 1B, already described, is a band diagram of the CIGS thin film solar cell of FIG. 1A, according to the prior art illustrative embodiment;

FIG. 2 is a schematic cross-sectional view of a quantum dot sensitized thin film solar cell having a copper-based absorber layer, according to an illustrative embodiment;

DETAILED DESCRIPTION

Figure 3:
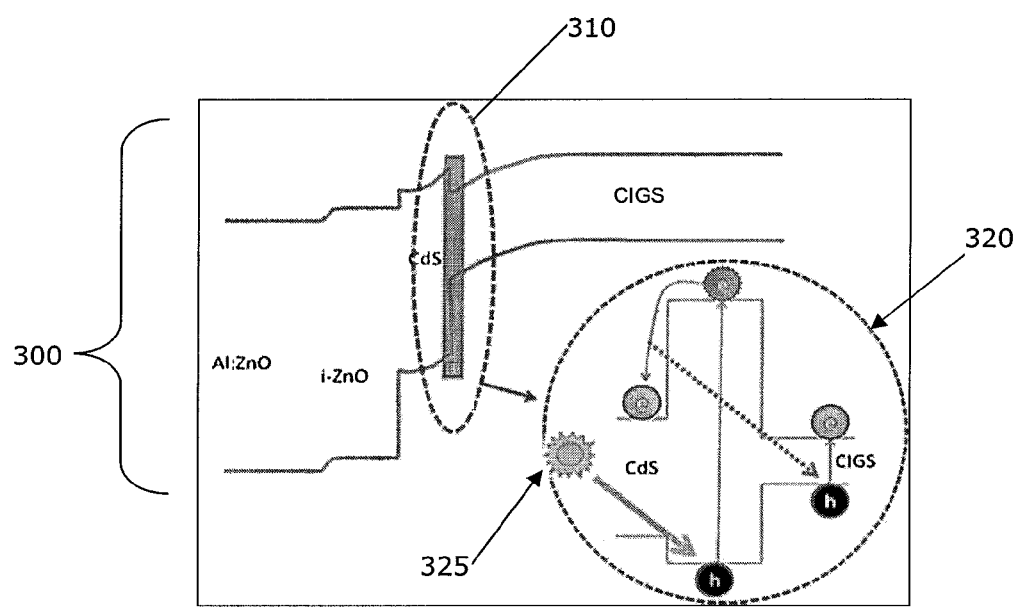
FIG. 3 is a band diagram of a PN junction of the quantum dot sensitized thin film solar cell of FIG. 2, showing the impact ionization effect, according to the illustrative embodiment.

A schematic cross-sectional view of a quantum dot (QD) sensitized thin film solar cell having a copper-based absorber layer is shown in FIG. 2, with the corresponding band-diagram shown in FIG. 3, according to an illustrative embodiment. With reference to FIG. 2, the QD sensitized thin film solar cell includes a bottom electrode layer 220, optical absorption layer 230, buffer layer 250 and top light transparent electrode layers 260 & 270 sequentially deposited on a substrate 210. A layer containing a plurality of quantum dots 240 is formed at the interface of the optical absorber layer 230 and the buffer layer 250. According to the illustrative embodiment, the QD layer comprises photosensitive nanoparticles. The absorption layer 230 comprises a p-type semiconductor layer and is in electrical communication with the bottom electrode layer 220. The photoactive QD layer 240 comprises photosensitive nanoparticles proximate the p-type absorber payer 230. The buffer layer 250 comprises an n-type layer, and is in contact with the QD layer 240 and top transparent electrode layers 260, 270. The top transparent electrode layers are in electrical communication with a top metal contact 280.

The presence of QD layers at the PN interface 310 (see FIG. 3) and the strong electric field created at the depletion region facilitate effective separation of electron-hole pairs generated in the QDs (see break-out detail 320 of FIG. 3). In addition, the electric field drives the separated charges to their respective electrodes and minimizes recombination of photogenerated carriers. Thus, as shown at 320, quantum size induced generation of multiple electron-hole pairs for a single photon 325, through the impact ionization and the Auger recombination effect, can be effectively separated and collected at the respective electrodes. Accordingly, this discloses a yield of higher photocurrent generation, resulting in solar cell efficiency greater than the efficiency observed employing prior art devices.

Quantum Dots (i.e. the nanoparticles) form a schottky junction solar cell that does not yield high efficiency by itself. Typically, according to the prior art, the nanoparticles are embedded in other semiconductor materials, for improved utilization of QDs. For example, InAs nanoparticles are inserted in GaAs host material thin film. Current CIGS solar cell gives its maximum efficiency of approximately 20% and its theoretical efficiency limit is approximately 31%. Introduction of QD's proximate the CIGS layer increases its theoretical efficiency limit to approximately 66%. The CIGS-based solar cells can create one electron-hole (charge) pairs for a photon. With the introduction of QDs, the solar cell can create multiple electron-hole pairs for a photon and it can extend the life-time of the generated charges (as shown in detail 320 of FIG. 3). The resulting solar cell has the ability to enhance the spectrum of light that used for energy conversion.

Referring back to FIG. 2, the optical absorber layer 230 can be formed according to a physical vapor deposition process (for example co-evaporation, sputtering and selenization, etc.), solution based process (such as electro-deposition, nanoparticle ink coating, etc.), and other techniques known in the art. Given that the buffer layer 250 is typically formed by chemical bath deposition, the optical absorber layer 230 can be coated together with the QD layer 240 by chemical bath deposition.

The optical absorber layer 230 is a copper-based substance selected from a group consisting of copper indium gallium diselenide (CIGS), copper indium diselenide (CIS), copper gallium diselenide (CGS), copper gallium ditelluride (CGT), and copper indium aluminum diselenide (CIAS). The n-type buffer layer is a substance selected from a group consisting of cadmium sulfide (CdS), zinc sulfide (ZnS), indium sulfide ($In_2S_3$), and other similar materials known to those skilled in the art.

A bandgap of the quantum dots 240 can cover an infrared (IR), a visible light and an ultraviolet (UV) bands of solar spectrum. Various types of QD materials can be simultaneously used to increase a photon absorption range. For example, if the bandgap of the QD is in the IR range, the material of the quantum dots is one or a plurality of substance (s) selected from a substance group consisting of PbS, GaSb, InSb, InAs and CIS, and other similar materials known to those skilled in the art.

If the bandgap of the quantum dots is in the visible light rage, the material of the quantum dots is one or a plurality of the substance selected from a substance group consists of InP and CdSe etc. If the bandgap of the quantum dots is in the UV range, the material of the quantum dots is one or a plurality of substance selected from a substance group consisting of $TiO_2$, ZnO and $SnO_2$ etc. Selection of the materials of the quantum dots is highly variable and determines the conduction feasibility of the conduction band energy levels of the optical absorber layer. The different types of materials can be used simultaneously to provide the desired coverage of solar spectrum.

Figure 4:
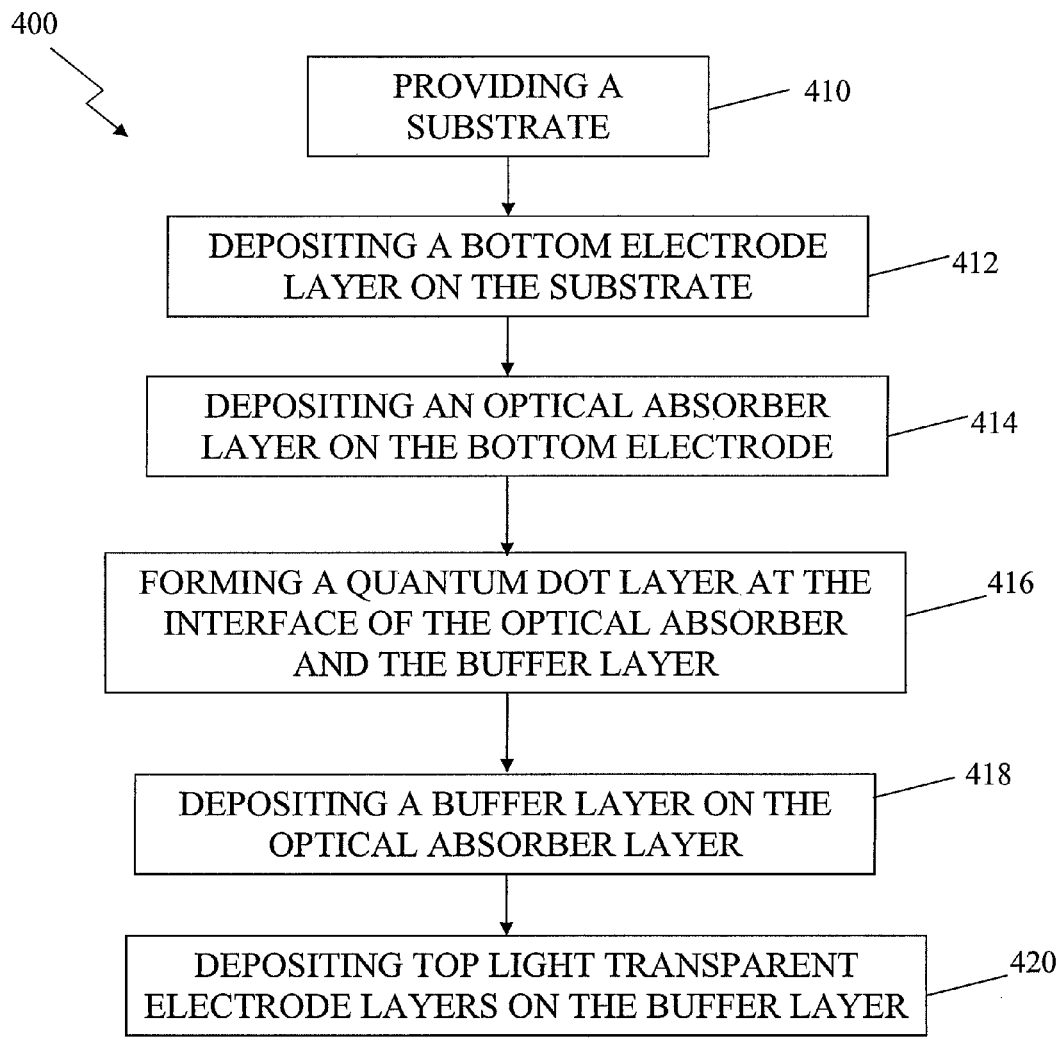
FIG. 4 is a flow diagram of a procedure for fabricating a quantum dot sensitized thin film solar cell according to the illustrative embodiment.

Reference is now made to FIG. 4 showing an illustrative procedure 400 for fabricating a PV device having a quantum dot sensitized interface with an optical absorber layer as shown and described herein in accordance with the illustrative embodiment. The steps of the procedure 400 correspond to the various steps in fabricating a QD sensitized thin film solar cell as shown in FIG. 2 and described herein. Accordingly, the layers comprise similar materials as described and are synthesized using techniques as described herein and known in the art. It is expressly contemplated that the steps can be performed in any order within ordinary skill to achieve the overall PV structure in accordance with the illustrative embodiments herein.

As shown, the procedure 400 commences at step 410 by providing a substrate. The substrate can comprise glass, polymer, stainless steel, or other substrates known in the art for use in solar cell applications and devices. According to the illustrative procedure, a bottom electrode layer is deposited on the substrate at step 412. The bottom electrode layer can comprise Mo (Molybdenum) or another appropriate layer that is deposited on the substrate. Then at step 414 an optical absorber layer is deposited on the bottom electrode layer. The optical absorber layer can comprise CIGS or any other appropriate optical absorber as described herein. At step 416, a QD layer is formed on the optical absorber. The QD layer can be coated by chemical bath deposition or another technique known in the art. A buffer layer is deposited on the optical absorber layer at step 418. The buffer layer can comprise a CdS layer, which allows some of the short-wavelength photons to be absorbed therein, according to illustrative embodiments. The buffer layer is typically formed by chemical bath deposition. Other techniques within ordinary skill can also be employed to achieve the overall PV cell structure. Finally, at step 420, top light transparent electrode layers are deposited on the buffer layer. The resulting thin film solar cell, for example as shown in FIG. 4, provides a higher yield of photocurrent generation, resulting in solar cell efficiency greater than the efficiency observed by prior art devices.

The foregoing has been a detailed description of illustrative embodiments of the invention. Various modifications and additions can be made without departing from the spirit and scope of this invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. For example, the illustrative embodiments can include additional layers to perform further functions or enhance existing, described functions. Likewise, while not shown, the electrical connectivity of the cell structure with other cells in an array and/or external conduit is expressly contemplated and highly variable within ordinary skill. More generally, while some ranges of layer thickness and illustrative materials are described herein, it is expressly contemplated that additional layers, layers having differing thicknesses and/or material choices can be provided to achieve the functional advantages described herein. In addition, directional and locational terms such as "top," "bottom," "center," "front," "back," "above," and "below" should be taken as relative conventions only, and not as absolute. Furthermore, it is expressly contemplated that various semiconductor and thin films fabrication techniques can be employed to form the structures described herein. Accordingly, this description is meant to be taken only by way of example, and not to otherwise limit the scope of this invention.

What is claimed is:

1. A photovoltaic devise comprising:
   a p-type absorber layer in electrical communication with a first electrode, the p-type absorber layer formed of a first material and being free of quantum dots;
   a quantum dot (QD) layer distinct from and proximate to the p-type absorber layer, the QD layer comprising photosensitive nanoparticles;
   an n-type buffer layer in contact with the QD layer and a second electrode, the n-type buffer layer being formed of a second material and being free of quantum dots, the second material being different from the first material; and wherein the quantum dot layer is located at the interface between the absorber layer and the buffer layer
   wherein at least one of the first electrode and the second electrode is transparent to solar radiation wherein the first material is selected from the group consisting of copper indium gallium diselenide (CIGS); copper indium diselenide (CIS); copper gallium diselenide (CGS); copper gallium ditelluride (CGT); and copper indium aluminum diselenide (CIAS).

2. The photovoltaic device of claim 1 wherein the QD layer comprises at least one of PbS, PbSe, GaSb, InSb, InAs, CIS, InP, CdSe TiO2, ZnO and SnO2.

3. The photovoltaic device of claim 1 wherein the second material is selected from the group consisting of: cadmium sulfide (CdS); zinc sulfide (ZnS); and indium sulfide (In2S3).

4. The photovoltaic device of claim 1 wherein the QD layer comprises a plurality of types of quantum dots, a first type of quantum dot having a bandgap in the infrared (IR) range, a second type of quantum dot having a bandgap in the visible light range, and a third type of quantum dot having a bandgap in the ultraviolet (UV) range of the electromagnetic spectrum.

* * * * *